(12) United States Patent
Razak

(10) Patent No.: US 8,238,061 B2
(45) Date of Patent: Aug. 7, 2012

(54) PRINTED CIRCUIT CABLE ASSEMBLY WITH STIFFENER PORTIONS AND FLEXIBLE PORTIONS

(75) Inventor: Ramlah Binte Abdul Razak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 480 days.

(21) Appl. No.: 12/392,711

(22) Filed: Feb. 25, 2009

(65) Prior Publication Data

US 2010/0214683 A1  Aug. 26, 2010

(51) Int. Cl.
*G11B 5/09* (2006.01)

(52) U.S. Cl. ............ 360/264.2; 360/46; 360/245.9; 360/266.3; 360/281; 360/281.7

(58) Field of Classification Search ........ 360/245.9, 360/264.2, 266.3, 281, 281.7, 125.31, 125.75
See application file for complete search history.

(56) References Cited

U.S. PATENT DOCUMENTS

| | | | |
|---|---|---|---|
| 5,095,396 A * | 3/1992 | Putnam et al. | 360/264.2 |
| 5,400,195 A * | 3/1995 | Morii et al. | 360/97.01 |
| 5,764,436 A | 6/1998 | Ngo et al. | |
| 5,781,380 A * | 7/1998 | Berding et al. | 360/264.2 |
| 5,886,850 A | 3/1999 | Kaezeus et al. | |
| 5,930,072 A | 7/1999 | Shrinkle | |
| 6,011,670 A | 1/2000 | Balsley, Jr. et al. | |
| 6,108,162 A | 8/2000 | Amirkiai et al. | |
| 6,166,888 A * | 12/2000 | Tsuda et al. | 360/264.2 |
| 6,208,489 B1 | 3/2001 | Marchon | |
| 6,754,041 B2 * | 6/2004 | Hong et al. | 360/97.02 |
| 7,054,110 B2 * | 5/2006 | Nakamura et al. | 360/264.2 |
| 7,411,763 B2 * | 8/2008 | Wu et al. | 360/264.2 |
| 7,522,384 B2 * | 4/2009 | Ho et al. | 360/264.2 |
| 2005/0245118 A1 | 11/2005 | Liu et al. | |

* cited by examiner

*Primary Examiner* — Tan T. Nguyen
(74) *Attorney, Agent, or Firm* — Lawrence J. Bassuk; W. James Brady; Frederick J. Telecky, Jr.

(57) ABSTRACT

A printed circuit cable assembly (PCCA) for a hard disk drive (HDD) is disclosed. The PCCA includes a stiffener portion having an elongated shape that includes an integrated circuit (IC) chip. The PCCA also includes a flexible portion extending from the elongated stiffener portion, wherein the PCCA is configured to be mountable on a headstack of the HDD such that an entire footprint of the IC chip overlays a metallic portion of the headstack of the HDD.

8 Claims, 3 Drawing Sheets

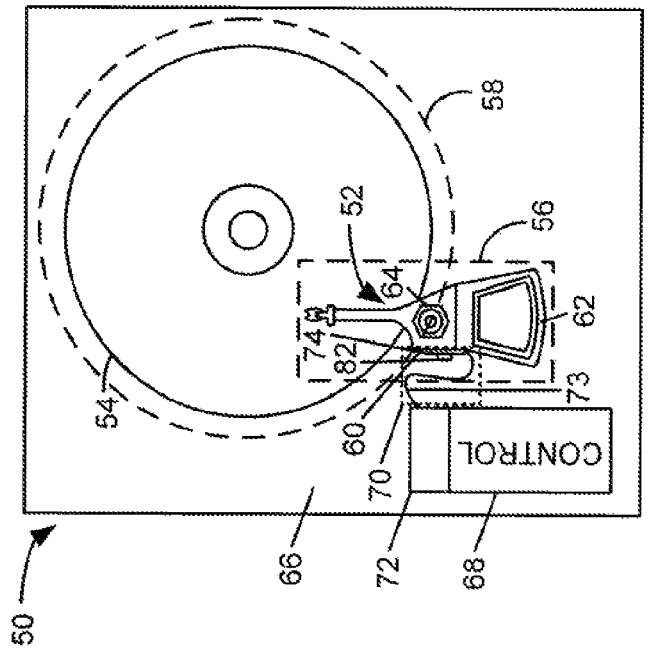
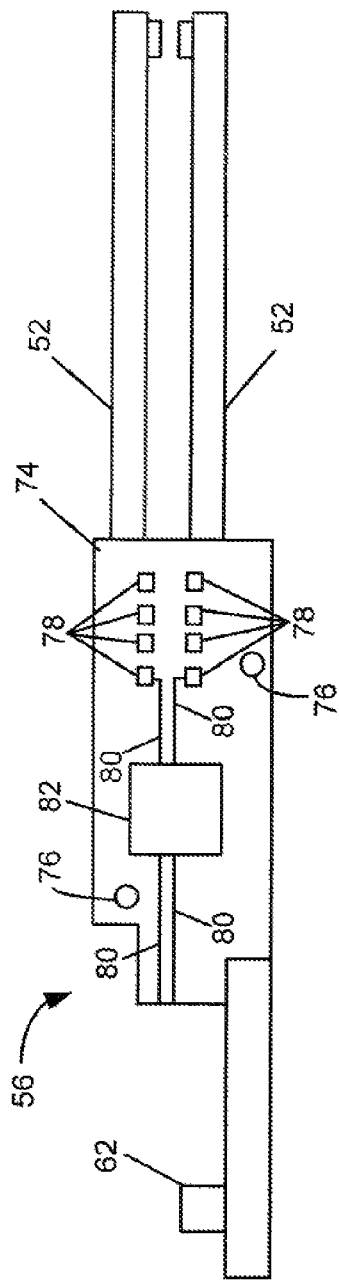

PRINTED CIRCUIT CABLE ASSEMBLY WITH STIFFENER PORTIONS AND FLEXIBLE PORTIONS

TECHNICAL FIELD

The present invention relates to printed circuits and more particularly to a printed circuit cable assembly for a hard disk drive.

BACKGROUND

A hard disk drive (HDD) is a non-volatile data storage device which stores digitally encoded data. HDDs record data by magnetizing ferromagnetic material directionally, to represent either a 0 or a 1 binary digit. HDDs read the data back by detecting the magnetization of the material. A typical HDD design consists of a spindle which holds one or more flat circular disks called platters, onto which the data is recorded. The platters can be mounted in a stacked configuration on the spindle, which can be referred to as a platter stack. The platters are made from a non-magnetic material, usually aluminum alloy or glass, and are coated with a thin layer of magnetic material.

Information is written to a platter as the platter rotates past a read/write head that operates in close proximity with the magnetic surface. The read/write head is used to detect and modify the magnetization of the material immediately under it. Typically, there is an associated read/write head for each platter surface on the platter stack. The read/write heads can be mounted in a stacked configuration, which can be referred to as a headstack. A motor, such as a stepper motor, moves the read/write heads in an arc (roughly radially) across the platters as the platters spin, allowing each read/write head to access almost the entire surface of the platter as it spins. Control circuitry (e.g., a controller) can provide controlling signals to the headstack that controls the reading and/or writing of data by read/write heads. A cable with a flexible portion can connect the controller with the headstack.

SUMMARY

One aspect of the invention is related to a printed circuit cable assembly (PCCA) for a hard disk drive (HDD). The PCCA includes a stiffener portion having an elongated shape that includes an integrated circuit (IC) chip. The PCCA also includes a flexible portion extending from the elongated stiffener portion, wherein the PCCA is configured to be mountable on a headstack of the HDD such that an entire footprint of the IC chip overlays a metallic portion of the headstack of the HDD.

Another aspect of the invention is related to a hard disk drive (HDD). The HDD comprising a platter stack that includes at least one HDD platter. The HDD also comprises a headstack that includes at least one read/write head that reads and/or writes data to and/or from the HDD platter. A controller is included that is configured to control the at least one read/write head of the headstack. A printed circuit cable assembly (PCCA) mounted on the headstack electrically couples the headstack to the controller. The PCCA includes an IC chip, wherein the IC chip has a thermal connection with a metallic portion of the headstack though a portion of the PCCA mounted flush against the metallic portion of the headstack.

Yet another aspect of the invention is related to another HDD comprising data storage means that stores data. Data read/write means are included that reads and/or writes data at the data storage means. Control means controls the data read/write means. Connection means couples the data read/write means to the control means. The connection means comprises pre-amplifying means that amplifies signals between the data read/write means and the control means. The connection means is in thermal contact with the read/write means. The pre-amplifying means has a thermal impedance of less than about 80 degrees Celsius per Watt.

BRIEF DESCRIPTION OF THE DRAWINGS

FIG. 1 illustrates an example of a hard disk drive (HDD) with a printed circuit cable assembly (PCCA) in accordance with an aspect of the invention.

FIG. 2 illustrates an example of a HDD headstack with a PCCA mounted in accordance with an aspect of the invention.

DETAILED DESCRIPTION

Figure 3:
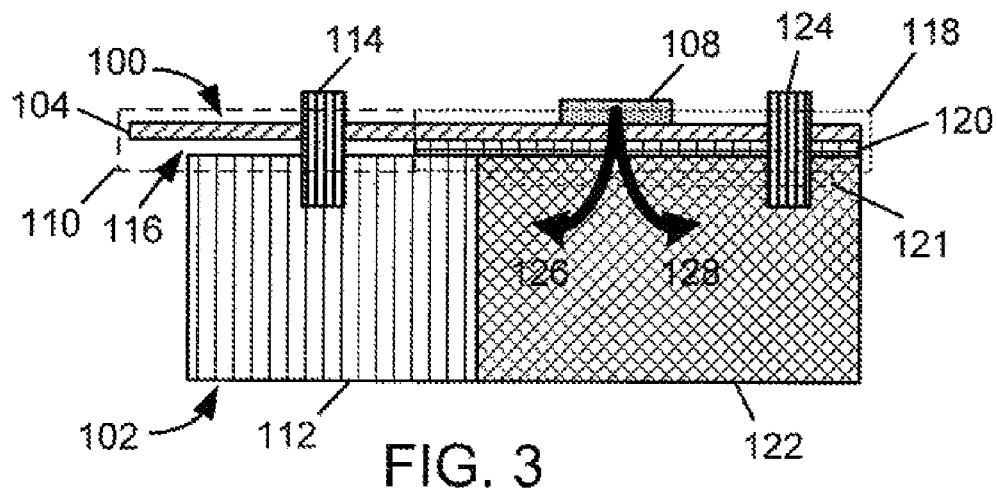
FIG. 3 illustrates an example of a cross-sectional view of a HDD headstack with a PCCA mounted in accordance with an aspect of the invention.

A hard disk drive (HDD), such as a 1.8 inch HDD, includes at least a read/write head that reads and/or writes data on a platter. The read/write head can be controlled by a controller that can provide an interface between the HDD and external systems (e.g., a computer motherboard). A printed circuit cable assembly (PCCA) can be included that connects the read/write head to the controller. The PCCA can include a pre-amplifier implemented as an integrated circuit (IC) chip that can reduce noise during data transfers between the read/write head and the controller.

Operation of the pre-amplifier causes a junction temperature (e.g., operating temperature) of the pre-amplifier to rise. However, the present PCCA and associated HDD are configured such that the entire footprint of the preamplifier overlays a metallic portion of the read/write head, thereby decreasing the thermal impedance of the preamplifier, which in turn reduces the preamplifier's junction temperature.

FIG. 1 illustrates an example of a HDD 50 in accordance with an aspect of the invention. The HDD 50 can include a read/write head 52 that reads and/or writes data on a platter 54. The platter 54 can be implemented as a computer readable medium, such as a magnetic disk. Typically, the HDD 50 is configured such that multiple read/write heads 52 are stacked, fastened and/or molded together to form a headstack 56, wherein each read/write head 52 in the headstack 56 reads and/or writes data at a corresponding platter 54 of a platter stack 58. The platter stack 58 can be implemented as a plurality of platters 54 mounted in a stacked configuration.

As one example, the headstack 56 can include a stepper motor (not shown) that moves the read/write heads relative to the platter stack 58. Each read/write head 52 can include an armature portion (e.g., "E-block") that includes a metallic portion 60 formed from a metal or metal alloy (e.g., steel, aluminum, titanium, etc.), and a plastic portion 62 formed from plastic or other material. Additionally, the headstack 56 can include a spindle 64 attached to a casing 66 of the HDD 50, such that each of the read/write heads 52 can rotate about a vertical axis of the spindle 64. A controller 68 that includes logical circuitry can also be included in the HDD 50. The controller 68 can control a position of each read/write head 52 in the headstack 56, and can control the reading and/or writing of data to/from each platter 54 in the platter stack 58.

A PCCA 70 can electrically couple the controller 68 to the read/write heads 52 of the headstack 56. The PCCA 70 can be attached to a connector 72 coupled to the controller 68. The PCCA 70 can be formed out of a polymer, such as polymide. A flexible ("flex") portion 73 of the PCCA 70 extends between the connector 72 and a portion of the PCCA 70 adhered with an adhesive to a stiffener material formed from a metal or metal alloy (e.g., steel, aluminum, titanium, etc.), which can be referred to a stiffener portion 74 of the PCCA 70. The flex portion 73 of the PCCA 70 is flexible to allow bending of the flex portion 73 so as to position the flex portion 73 in a variety of different configurations. The stiffener portion 74 of the PCCA 70 provides a rigid area for the mounting of surface mount components (e.g., IC chips). As illustrated in FIG. 2, the stiffener portion 74 of the PCCA 70 can be mounted along a side of the metallic portion of the armature 60 and the plastic portion of the armature 62 of the headstack 56. For purposes of simplification of explanation, the same reference numbers in FIGS. 1 and 2 are used to indicate the same structure. The stiffener portion 74 can be mounted to the metallic portion of the armature 60 and the plastic portion of the armature 62 with bonding posts 76.

To electrically couple the headstack 56 to the controller 68, the PCCA 70 can include connection pads 78 (e.g., solder balls) that can electrically couple the headstack 56 to the controller 68 via signal traces 80 etched on the PCCA 70. For purposes of simplification of explanation, four signal traces 80 are illustrated, but one skilled in the art will appreciate that more or less signal traces 80 could be implemented. Additionally, the stiffener portion 74 of the PCCA 70 can include an IC chip implemented as a preamplifier 82 that reduces noise during data transfers between the platter 54 and the controller 68 (via a read/write head 52). The PCCA 70 and the read/write head 52 can be configured such that the entire footprint of the preamplifier 82 overlays the metallic portion of the armature 60 at a region referred to as a hub region.

When the preamplifier 82 amplifies an incoming signal from a read/write head 52 or the controller 68, a junction (e.g., core) temperature preamplifier increases. A temperature at which the preamplifier 82 operates is a primary determinant of the preamplifier's 82 reliability. Heat dissipating in the device during operation escapes through a path between points 'J' and 'A'. Typically, the point 'J' corresponds to a point inside a die of the preamplifier, while the point 'A' corresponds to a point in ambient air. The junction temperature can be computed with Equation 1:

$$T_j = T_{AMB} + (Pd * R_{JA})$$  Eq. 1 where $T_j$ is the junction temperature of the preamplifier 82, in degrees Celsius (° C.);

$T_{AMB}$ is the ambient air temperature, in ° C.;

Pd is the power dissipation of the preamplifier 82, in Watts (W); and $R_{JA}$ is the thermal impedance of the preamplifier 82, in degrees Celsius per Watt (° C./W), which is equal to the sum of all thermal impedances between the die of the preamplifier 82 at point 'J' and the point 'A' in the ambient air.

As it can be seen from Equation 1, reduction in the thermal impedance $R_{JA}$ of the preamplifier 82 reduces the junction temperature $T_j$. The stiffener portion 74 of the PCCA 70 can be mounted flush against the headstack 56 such that thermal contact between the metallic portion of the armature 60 and the preamplifier 82 is established. Accordingly, heat can be dissipated through the headstack 56, such that the thermal impedance $R_{JA}$ of the preamplifier 82 is reduced, which in turn reduces the junction temperature $T_j$ of the preamplifier 82.

Figure 4:
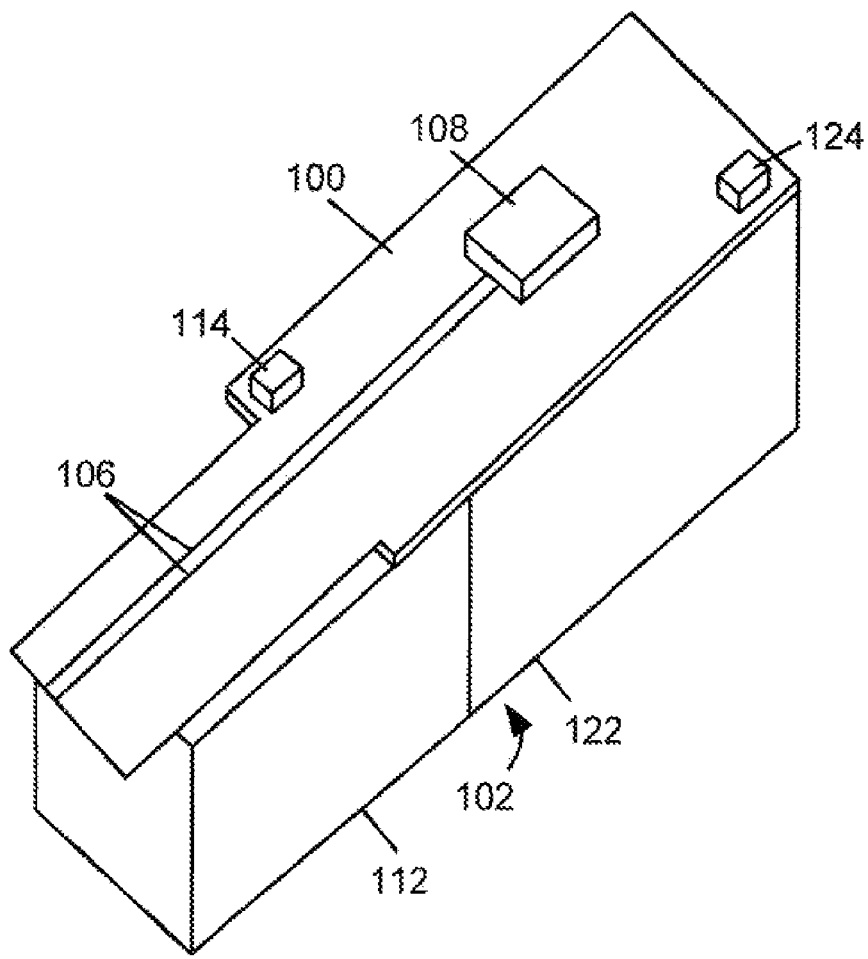
FIG. 4 illustrates a perspective view of the HDD headstack with the PCCA mounted as illustrated in FIG. 3.

FIGS. 3 and 4 illustrate respective cross sectional and perspective views of a portion of a PCCA 100 mounted onto a side of a headstack 102 (such as illustrated in FIGS. 1 and 2) in accordance with an aspect of the invention. For purposes of simplification of explanation, the same reference numbers are used in FIGS. 3 and 4 to indicate the same structure. The PCCA 100 includes a polymer layer 104, which can be formed from polyimide. The PCCA 100 can include electrical traces 106 to electrically couple the PCCA 100 to other regions of the PCCA 100, external systems (such as a controller), or components mounted on the PCCA 100, such as a preamplifier 108. Although the PCCA 100 illustrated in FIGS. 3 and 4 illustrates four signal traces 80, one skilled in the art will appreciate that more or less signal traces 80 can be employed. A flex portion 110 of the PCCA 100 can be mounted to a plastic portion of an armature 112 the headstack 102 via a first bonding post 114. A gap 116 may be formed between the plastic portion the armature 112 and the flex portion 110 of the PCCA 100. However, in other implementations, the flex portion 110 can be flush against the plastic portion of the armature 112. A stiffener portion 118 of the PCCA 100 can be implemented as the polymer layer 104 adhered to a stiffener layer 120, which stiffener layer 120 can be formed out of a metal alloy or a metal. The stiffener portion 118 of the PCCA 100 can be mounted flush against a hub region 121 of a metallic portion of the armature 122 the headstack 102 (e.g., at an "E-block") with a second bonding post 124, such that a thermal contact is established between the preamplifier 108 and a metallic portion of the armature 122. In such an implementation, almost no air gap exists between the preamplifier 108 and the metallic portion of the armature 122.

The PCCA 100 can be configured such that the entire footprint of the preamplifier 108 overlays the metallic portion of the armature 122. Such a configuration can maximize thermal transfer between the preamplifier 108 and the headstack 102. In such a situation, arrows indicated at 126 and 128 can illustrate a heat path when the preamplifier 108 is dissipating heat, such as when the preamplifier 108 is amplifying. Configuring the PCCA 100 in a manner illustrated in FIGS. 3 and 4 can reduce the thermal impedance $R_{JA}$ of the preamplifier 108, which in turn can reduce the junction temperature $T_j$ of the preamplifier 108, as indicated by Equation 1. For instance, configuring the PCCA 100 in the manner illustrated in FIGS. 3 and 4 can reduce the thermal impedance $R_{JA}$ of the preamplifier 108 to less than 100° C./W, such as to about 94 C/W. Such a reduction can cause the junction temperature $T_j$ to correspondingly reduce to about 80° C. or less, such as to about 77° C.

Figure 5:
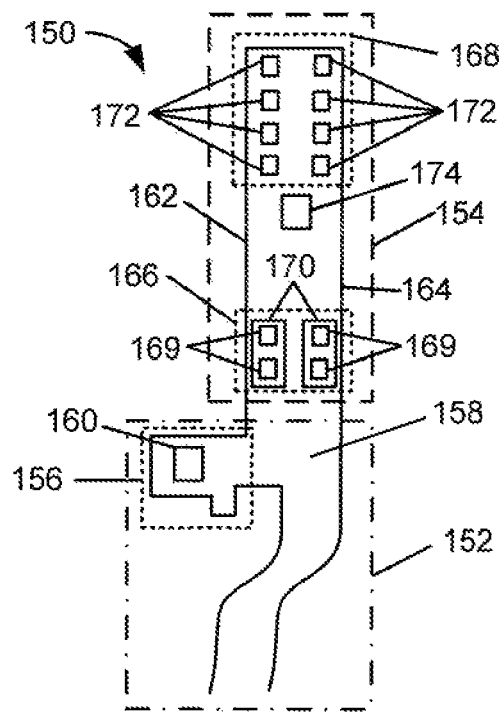
FIG. 5 illustrates a portion of a PCCA in accordance with an aspect of the invention.

FIG. 5 illustrates an example of a portion of a PCCA 150 in accordance with an aspect of the invention. The PCCA 150 can be formed, for example, as a ribbon cable. The PCCA 150 includes a flex portion 152 and a stiffener portion 154. The stiffener portion 154 can be adhered with an adhesive to a stiffening material (e.g., a metal or metal alloy) to prevent movement. As discussed above, the flex portion 152 is relatively flexible. The flex portion 152 can include a protrusion region 156 (e.g., a tongue portion) that laterally extends from a body portion 158 of the PCCA 150. In one example, a capacitor 160 can be mounted on the protrusion region 156, although one skilled in the art will appreciate that other electrical components could be mounted additionally or alternatively.

The stiffener portion 154 can be formed as an elongated member, such that first and second edges 162 and 164 of the stiffener portion 154 extend parallel to each other. The stiffener portion 154 includes a component region 166 and a connection region 168. The component region 166 can include surface mounted circuit components, such as capacitors 170. Although FIG. 5 illustrates that the PCCA 150 includes four metallic (e.g., copper) land pads 169 for coupling two capacitors 170, one skilled in the art will appreciate that more or less capacitors 170 (or other circuit components) could be employed. The connection region 168 can include connection pads 172 (e.g., solder balls) that can be employed to electrically couple the PCCA 150 to an armature of a headstock, at for example, a hub region, such as illustrated in FIGS. 1-4. Although eight such connection pads 172 are illustrated, one skilled in the art will appreciate that more or less connection pads 172 could be implemented. Moreover, a preamplifier 174, in the form of an IC chip, can also be mounted on the PCCA 150 in the flex portion 152.

The stiffener portion 154 of the PCCA 150 has an elongated shape to eliminate the need for any "fold-over" regions that might extend laterally from the stiffener portion 154. Elimination of such fold-over regions allows for a flush contact between the stiffener portion 154 of the PCCA 150 and the armature of the headstock, as discussed above.

Figure 6:
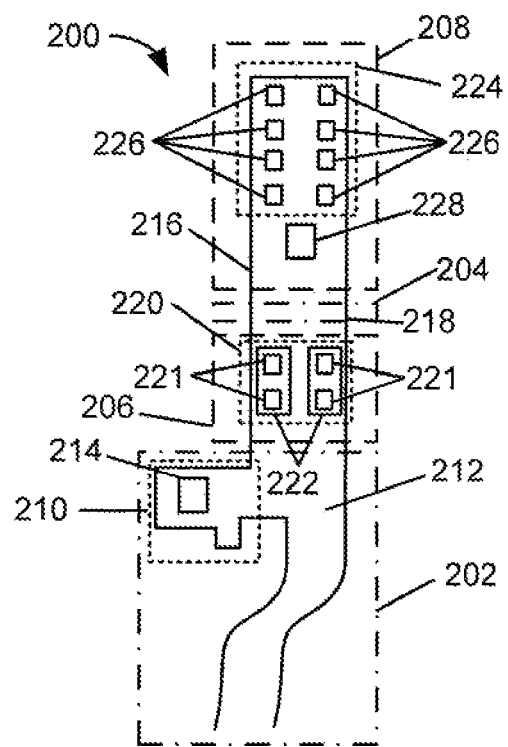
FIG. 6 illustrates another example of a portion of a PCCA in accordance with an aspect of the invention.

FIG. 6 illustrates another example of a portion of a PCCA 200 in accordance with an aspect of the invention. The PCCA 200 can be formed, for example, as a ribbon cable. The PCCA 200 includes two separate flex portions, namely, a first flex portion 202 and a second flex portion 204. The PCCA 200 also includes two separate stiffener portions, namely a first stiffener portion 206 and a second stiffener portion 208. The first and second stiffener portions 206 and 208 can be adhered with adhesive to stiffening materials (e.g., a metal or metal alloy) to prevent movement. As discussed above, the first and second flex portions 202 and 204 are relatively flexible. The first flex portion 202 can include a protrusion region 210 (e.g., a tongue portion) that laterally extends from a body portion 212 of the PCCA 150. In one example, a capacitor 214 can be mounted on the protrusion region 210, although one skilled in the art will appreciate that other electrical components could be mounted additionally or alternatively.

The first and second stiffener portions 206 and 208, as well as the second flex portion 204 of the PCCA 200 can be formed as an elongated member, such that first and second edges 216 and 218 common to the first and second stiffener portions 206 and 208 and the second flex portion 204 are continuous and extend parallel to each other. The first stiffener portion 206 includes a component region 220. The component region 220 can include surface mounted circuit components, such as capacitors 222. As with the PCCA 150 illustrated in FIG. 5, the PCCA 200 illustrated in FIG. 6 includes four metallic (e.g., copper) land pads 221 for coupling two capacitors 222, but one skilled in the art will appreciate that more or less capacitors 222 (or other circuit components) could be employed. The second stiffener portion can include a connection region 224 that can include connection pads 226 (e.g., solder balls) that can be employed to electrically couple the PCCA 200 to an armature of a headstock, at for example, a hub region, such as illustrated in FIGS. 1-4. Although eight such connection pads 226 are illustrated, one skilled in the art will appreciate that more or less connection pads 226 could be implemented. Moreover, a preamplifier 228, in the form of an IC chip, can also be mounted on the PCCA 200 in the second stiffener portion 208.

The first and second stiffener portions 206 and 208, and the second flex portion 204 of the PCCA 200 form a continuous elongated shape to eliminate the need for any "fold-over" regions that might extend laterally from the first and second stiffener portions 206 and 208 and the second flex portion 304. Elimination of such fold-over regions allows for a flush contact between the second stiffener portion 208 of the PCCA 200 and the armature of the headstack, as discussed above. Moreover, the configuration illustrated in FIG. 6 allows the PCCA 200 to accommodate specific HDD headstack configurations.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A printed circuit cable assembly (PCCA) for a hard disk drive (HDD) comprising:
   a stiffener portion having an elongated shape that includes an integrated circuit (IC) chip; and
   a flexible portion extending from the elongated stiffener portion, wherein the PCCA is configured to be mountable on a headstack of the HDD such that an entire footprint of the IC chip overlays a metallic portion of the headstack of the HDD,
   wherein the stiffener portion is a first stiffener portion, the flexible portion is a first flexible portion, further comprising:
   a second stiffener portion extending from the first flexible portion; and
   a second flexible portion extending from the second stiffener portion.

2. The PCCA of claim 1, wherein the second stiffener portion includes a plurality of capacitors.

3. The PCCA of claim 1, wherein the first stiffener portion, the first flexible portion and the second stiffener portion form an elongated member with a continuous pair of parallel edges.

4. The PCCA of claim 1, wherein the IC chip is a preamplifier.

5. The PCCA of claim 4, wherein the stiffener portion further includes a plurality of capacitors.

6. The PCCA of claim 5, wherein the stiffener portion further includes a plurality of connection leads for electrically coupling the PCCA to the headstack of the HDD.

7. A printed circuit cable assembly for a hard disk drive comprising:
   A. a substrate formed of a polymer having a first stiffener portion, a second stiffener portion, a first flexible portion between the first stiffener portion and the second stiffener portion, and a second flexible portion adjacent the second stiffener portion opposite the first flexible portion;
   B. an integrated circuit chip mounted on a stiffener portion that is adapted to be mounted on a headstack of the hard disk drive such that an entire footprint of the integrated circuit chip overlays a metallic portion of the headstack.

8. The assembly of claim 7 including a piece of metal stiffener material having a first side adhered to the first stiffener portion of the substrate on a side of the substrate opposite the integrated circuit and having an opposite side adapted to be mounted alongside the headstack.

* * * * *